(12) United States Patent
Pan et al.

(10) Patent No.: US 8,278,394 B2
(45) Date of Patent: Oct. 2, 2012

(54) INDENOFLUORENE POLYMER BASED ORGANIC SEMICONDUCTOR MATERIALS

(75) Inventors: Junyou Pan, Frankfurt (DE); Susanne Heun, Bad Soden (DE); Frank Meyer, Winchester (GB)

(73) Assignee: Merck Patent Gesellschaft mit Beschränkter Haftung, Darmstadt (DE)

( * ) Notice: Subject to any disclaimer, the term of this patent is extended or adjusted under 35 U.S.C. 154(b) by 845 days.

(21) Appl. No.: 12/300,346

(22) PCT Filed: Apr. 13, 2007

(86) PCT No.: PCT/EP2007/003284
§ 371 (c)(1),
(2), (4) Date: Nov. 11, 2008

(87) PCT Pub. No.: WO2007/131582
PCT Pub. Date: Nov. 22, 2007

(65) Prior Publication Data
US 2009/0149627 A1    Jun. 11, 2009

(30) Foreign Application Priority Data

May 12, 2006 (EP) .................................. 06009884

(51) Int. Cl.
*C08L 23/00* (2006.01)
*C08L 23/18* (2006.01)
*C08G 61/10* (2006.01)

(52) U.S. Cl. ........ 525/242; 525/244; 525/293; 525/540; 528/397; 528/422

(58) Field of Classification Search .................. 525/293, 525/242, 244, 540; 528/397, 422
See application file for complete search history.

(56) References Cited

U.S. PATENT DOCUMENTS

| 5,856,434 A | 1/1999 | Stern et al. |
| 2006/0046092 A1 | 3/2006 | Towns et al. |
| 2006/0192198 A1 | 8/2006 | Uckert |
| 2006/0241202 A1 | 10/2006 | Wallace |
| 2006/0251886 A1 | 11/2006 | Müller et al. |
| 2007/0034862 A1 | 2/2007 | Parham et al. |

FOREIGN PATENT DOCUMENTS

| DE | 43 31 401 A1 | 3/1995 |
| WO | WO 2004/041901 A1 | 5/2004 |
| WO | WO 2004/106409 A1 | 12/2004 |
| WO | WO 2005/024971 A1 | 3/2005 |
| WO | WO 2005/042176 A1 | 5/2005 |
| WO | WO 2006/015862 A1 | 2/2006 |

OTHER PUBLICATIONS

E.J. Meijer et al., "Solution-Processed Ambipolar Organic Field-Effect Transistors and Inverters", Nature Materials, vol. 2 (Oct. 2003) pp. 678-682.
H.W. Schmidt et al., "Makromolekulare Chemie" Nachrichten aus der Chemie, vol. 53 (Mar. 2005) pp. 310-311.

*Primary Examiner* — Duc Truong
(74) *Attorney, Agent, or Firm* — Millen, White, Zelano & Branigan, P.C.

(57) ABSTRACT

The invention relates to polymers comprising indenofluorene units or derivatives thereof, organic semiconductor (OSC) materials comprising them, their use in electronic or electrooptical devices, and devices comprising said polymers or materials.

40 Claims, 2 Drawing Sheets

INDENOFLUORENE POLYMER BASED ORGANIC SEMICONDUCTOR MATERIALS

FIELD OF THE INVENTION

The invention relates to polymers comprising indenofluorene units or derivatives thereof, organic semiconductor (OSC) materials comprising them, their use in electronic or electrooptical devices, and devices comprising said polymers or materials.

BACKGROUND AND PRIOR ART

In recent years, there has been development of organic semiconducting (OSC) materials in order to produce more versatile, lower cost electronic devices. Such materials find application in a wide range of devices or apparatus, including organic field effect transistors (OFETs), organic light emitting diodes (OLEDs), photodetectors, photovoltaic (PV) cells, sensors, memory elements and logic circuits to name just a few. The organic semiconducting materials are typically present in the electronic device in the form of a thin layer, for example less than 1 micron thick.

The performance of OFET devices is principally based upon the charge carrier mobility of the semiconducting material and the current on/off ratio, so the ideal semiconductor should have a low conductivity in the off state, combined with a high charge carrier mobility ($>1 \times 10^{-3}$ cm$^2$ V$^{-1}$ s$^{-1}$). In addition, it is important that the semiconducting material is relatively stable to oxidation i.e. it has a high ionisation potential, as oxidation leads to reduced device performance. Further requirements for the semiconducting material are a good processability, especially for large-scale production of thin layers and desired patterns, and high stability, film uniformity and integrity of the organic semiconductor layer.

In prior art various materials have been proposed for use as organic semiconductors in OFETs, including small molecules like for example pentacene, and polymers like for example polyhexylthiophene. However, the materials and devices investigated so far do still have several drawbacks, and their properties, especially the processability, charge-carrier mobility, on/off ratio and stability do still leave room for further improvement.

One aim of the present invention is to provide new organic semiconducting materials for use in electronic devices, which have advantageous properties, in particular good processability, high charge-carrier mobility, high on/off ratio, high oxidative stability and long lifetime in electronic devices. Another aim is to extend the pool of semiconducting materials available to the expert. Other aims of the present invention are immediately evident to the expert from the following detailed description.

It has been found that these aims can be achieved by providing semiconducting materials as claimed in the present invention. These materials are based on polymers comprising one or more cis- or trans-indenofluorene units of the following formulae, or derivatives thereof

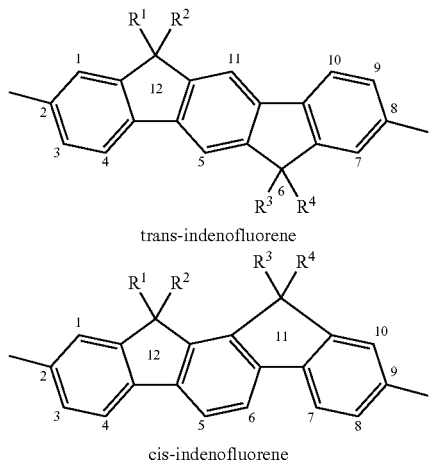

trans-indenofluorene cis-indenofluorene (wherein $R^{1-4}$ denote aromatic or aliphatic hydrocarbyl groups, and two adjacent groups $R^{1,2}$ or $R^{3,4}$ may also form a spiro group),
and further comprising one or more moieties having hole or electron transport properties, like for example triarylamine groups. In particular, it has been found that such polymers are suitable for use as semiconducting materials in electronic devices like transistors, and as charge transport layer or interlayer in polymer light emitting diodes (PLEDs), as they have good processability and at the same time show a surprisingly high charge carrier mobility and high oxidative stability.

WO 2004/041901 describes polymers comprising aryl-substituted indenofluorenes and further units like triarylamine or heteroaryl moieties, and their use in OLED or OFET devices, but does not disclose polymers as claimed in the present invention. WO 2005/024971 shows a specific copolymer comprising 30% 11,11,12,12-tetraoctyl-indenofluorene, but does not disclose polymers as claimed in the present invention.

Triarylamines have good hole transport ability. However, they have only moderate solubility in many organic solvents, which does negatively affect their processability in a film-forming process and leads to films with moderate uniformity. Indenofluorenes, on the other hand, are soluble in conventional organic solvents and thus show good processability, enabling the formation of films with high uniformity. However, they have been reported mainly to be efficient electron transporting and light-emitting moieties. It was therefore surprising that a polymer according to the present invention, wherein indenofluorene units are combined with hole transporting moieties like triarylamines, shows high charge carrier mobility and enables the preparation of electronic devices like transistors with high on/off ratios.

SUMMARY OF THE INVENTION

The invention relates to polymers comprising >0 mol % and <50 mol % of one or more identical or different indenofluorene units of formula I

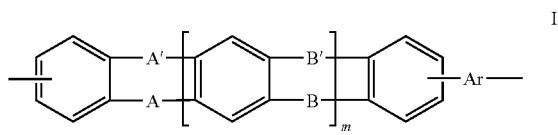

wherein
one of A and A' is a single bond and the other is $CR^1R^2$,
one of B and B' is a single bond and the other is $CR^3R^4$,
$R^{1-4}$ are independently of each other identical or different groups selected from H, halogen, —CN, —NC, —NCO, —NCS, —OCN, —SCN, —C(=O)NR$^0$R$^{00}$, —C(=O)X, —C(=O)R$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, optionally substituted silyl, or carbyl or hydrocarbyl with 1 to 40 C atoms that is optionally substituted and optionally comprises one or more hetero atoms,
X is halogen,
$R^0$ and $R^{00}$ are independently of each other H or an optionally substituted carbyl or hydrocarbyl group optionally comprising one or more hetero atoms,
Ar is a single bond or denotes mononuclear or polynuclear aryl or heteroaryl,
m is an integer $\geq 1$, and
wherein optionally the groups $R^1$ and $R^2$ and/or the groups $R^3$ and $R^4$ form a spiro group with the adjacent fluorene moiety, with the proviso that the following copolymers are excluded

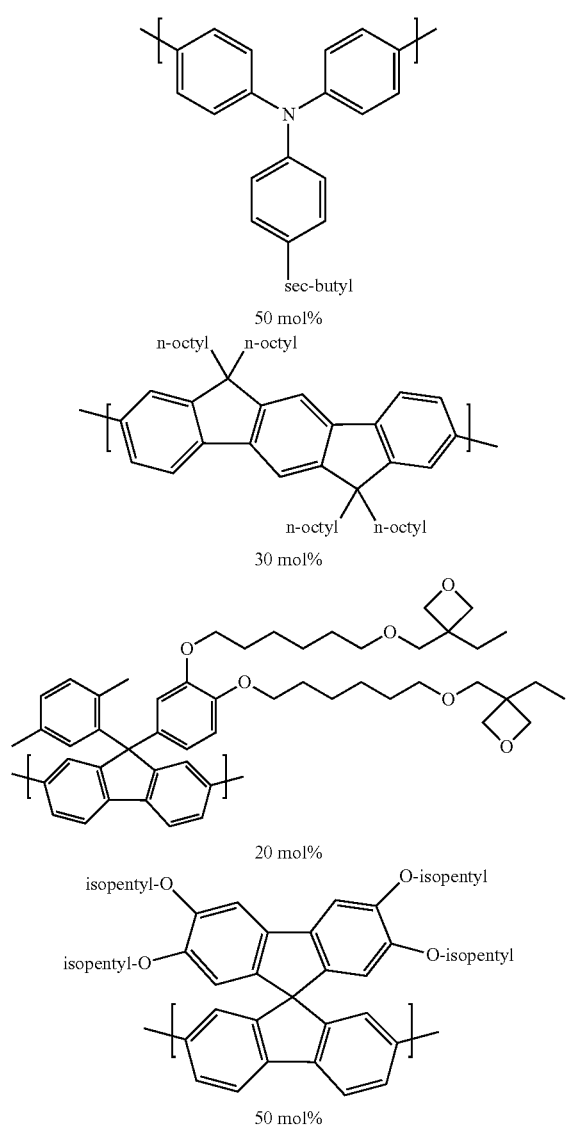

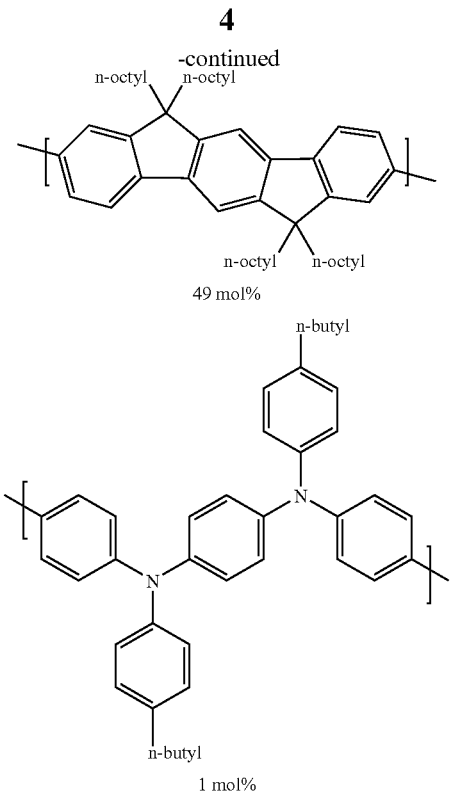

The invention further relates to polymers as defined above, comprising not more than two, preferably consisting of two, different types of units, one of which is selected of formula I and the other is selected of units having hole or electron transporting properties.

The invention further relates to an organic semiconductor (OSC) material, layer or component comprising one or more polymers as described above and below.

The invention further relates to the use of the polymers or materials as described above and below in an electronic or electrooptical component or device.

The invention further relates to an electronic or electrooptical component or device comprising a polymer or material as described above and below.

Said component or device includes, without limitation, organic field effect transistor (OFET), thin film transistor (TFT), integrated circuit (IC), radio frequency identification (RFID) tag, photodetector, sensor, logic circuit, memory element, capacitor, organic photovoltaic (OPV) cell, charge injection layer, charge transport layer or interlayer in polymer light emitting diodes (PLEDs), Schottky diode, planarising layer, antistatic film, polymer electrolyte membrane (PEM), conducting substrate or pattern, photoconductor, electrophotographic element or organic light emitting diode (OLED).

DETAILED DESCRIPTION OF THE INVENTION

Figure 1:
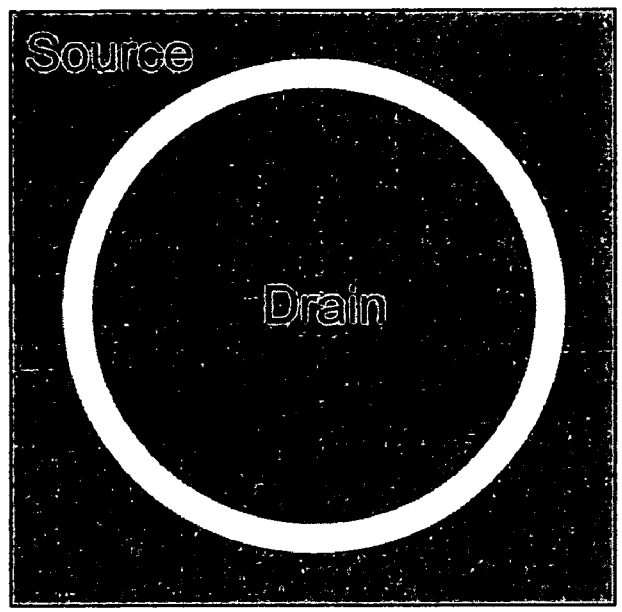
FIG. 1 shows the geometry of a transistor used in example 1 of the present invention.

Unless stated otherwise, groups or indices like Ar, $R^{1-4}$, n etc. in case of multiple occurrence are selected independently from each other and may be identical or different from each other. Thus, several different groups might be represented by a single label like "$R^1$".

The term 'unit' means a monomer unit or a repeating unit in a polymer or copolymer.

The terms 'alkyl', 'aryl', 'heteroaryl' etc. also include multivalent species, for example alkylene, arylene, 'heteroarylene' etc.

The term 'carbyl group' as used above and below denotes any monovalent or multivalent organic radical moiety which comprises at least one carbon atom either without any non-carbon atoms (like for example —C≡C—), or optionally combined with at least one non-carbon atom such as N, O, S, P, Si, Se, As, Te or Ge (for example carbonyl etc.). The terms 'hydrocarbon group', and 'hydrocarbyl group' denote a carbyl group that does additionally contain one or more H atoms and optionally contains one or more hetero atoms like for example N, O, S, P, Si, Se, As, Te or Ge.

A carbyl or hydrocarbyl group comprising a chain of 3 or more C atoms may be linear, branched and/or cyclic, including spiro and/or fused rings.

Preferred carbyl and hydrocarbyl groups include alkyl, alkoxy, alkylcarbonyl, alkoxycarbonyl, alkylcarbonyloxy and alkoxycarbonyloxy, each of which is optionally substituted and has 1 to 40, preferably 1 to 25, very preferably 1 to 18 C atoms, furthermore optionally substituted aryl or aryloxy having 6 to 40, preferably 6 to 25 C atoms, furthermore alkylaryl, arylalkyl, alkylaryloxy, arylalkyloxy arylcarbonyl, aryloxycarbonyl, arylcarbonyloxy and aryloxycarbonyloxy, each of which is optionally substituted and has 6 to 40, preferably 6 to 25 C atoms.

The carbyl or hydrocarbyl group may be a saturated or unsaturated acyclic group, or a saturated or unsaturated cyclic group. Unsaturated acyclic or cyclic groups are preferred, especially alkenyl and alkynyl groups (especially ethynyl). Where the $C_1$-$C_{40}$ carbyl or hydrocarbyl group is acyclic, the group may be linear or branched.

The $C_1$-$C_{40}$ carbyl or hydrocarbyl group includes for example: $C_1$-$C_{40}$ alkyl, $C_2$-$C_{40}$ alkenyl, $C_2$-$C_{40}$ alkynyl, $C_3$-$C_{40}$ allyl group, $C_4$-$C_{40}$ alkyldienyl, $C_4$-$C_{40}$ polyenyl, $C_6$-$C_{40}$ aryl, $C_6$-$C_{40}$ alkylaryl, $C_6$-$C_{40}$ arylalkyl, $C_6$-$C_{40}$ alkylaryloxy, $C_6$-$C_{40}$ arylalkyloxy, $C_6$-$C_{40}$ heteroaryl, $C_4$-$C_{40}$ cycloalkyl, $C_4$-$C_{40}$ cycloalkenyl, and the like. Very preferred are $C_1$-$C_{20}$ alkyl, $C_2$-$C_{20}$ alkenyl, $C_2$-$C_{20}$ alkynyl, $C_3$-$C_{20}$ allyl, $C_4$-$C_{20}$ alkyldienyl, $C_6$-$C_{12}$ aryl, $C_6$-$C_{20}$ arylalkyl and $C_6$-$C_{20}$ heteroaryl.

Further preferred carbyl and hydrocarbyl groups include straight-chain, branched or cyclic alkyl with 1 to 40, preferably 1 to 25 C-atoms, which is unsubstituted, mono- or polysubstituted by F, Cl, Br, I or CN, and wherein one or more non-adjacent $CH_2$ groups are optionally replaced, in each case independently from one another, by —O—, —S—, —NH—, —$NR^0$—, —$SiR^0R^{00}$—, —CO—, —COO—, —OCO—, —O—CO—O—, —S—CO—, —CO—S—, —$SO_2$—, —CO—$NR^0$—, —$NR^0$—CO—, —$NR^0$—CO—$NR^{00}$—, —$CX^1$=$CX^2$— or —C≡C— in such a manner that O and/or S atoms are not linked directly to one another, with $R^0$ and $R^{00}$ having one of the meanings given as described above and below and $X^1$ and $X^2$ being independently of each other H, F, Cl or CN.

$R^0$ and $R^{00}$ are preferably selected from H, straight-chain or branched alkyl with 1 to 12 C atoms or aryl with 6 to 12 C atoms.

Halogen is F, Cl, Br or I.

Preferred alkyl groups include, without limitation, methyl, ethyl, n-propyl, i-propyl, n-butyl, i-butyl, s-butyl, t-butyl, 2-methylbutyl, n-pentyl, s-pentyl, cyclopentyl, n-hexyl, cyclohexyl, 2-ethylhexyl, n-heptyl, cycloheptyl, n-octyl, cyclooctyl, dodecanyl, trifluoromethyl, perfluoro-n-butyl, 2,2,2-trifluoroethyl, perfluorooctyl, perfluorohexyl etc.

Preferred alkenyl groups include, without limitation, ethenyl, propenyl, butenyl, pentenyl, cyclopentenyl, hexenyl, cyclohexenyl, heptenyl, cycloheptenyl, octenyl, cyclooctenyl etc.

Preferred alkynyl groups include, without limitation, ethynyl, propynyl, butynyl, pentynyl, hexynyl, octynyl etc.

Preferred alkoxy groups include, without limitation, methoxy, ethoxy, 2-methoxyethoxy, n-propoxy, i-propoxy, n-butoxy, i-butoxy, s-butoxy, t-butoxy, 2-methylbutoxy, n-pentoxy, n-hexoxy, n-heptoxy, n-octoxy etc.

Preferred amino groups include, without limitation, dimethylamino, methylamino, methylphenylamino, phenylamino, etc.

Aryl groups may be mononuclear, i.e. having only one aromatic ring (like for example phenyl or phenylene), or polynuclear, i.e. having two or more aromatic rings which may be fused (like for example napthyl or naphthylene), individually covalently linked (like for example biphenyl), and/or a combination of both fused and individually linked aromatic rings. Preferably the aryl group is an aromatic group which is substantially conjugated over substantially the whole group.

Preferred aryl groups include, without limitation, benzene, biphenylene, triphenylene, [1,1':3',1"]terphenyl-2'-ylene, naphthalene, anthracene, binaphthalene, phenanthrene, pyrene, dihydropyrene, chrysene, perylene, tetracene, pentacene, benzpyrene, fluorene, indene, indenofluorene, spirobifluorene, etc.

Preferred heteroaryl groups include, without limitation, 5-membered rings like pyrrole, pyrazole, imidazole, 1,2,3-triazole, 1,2,4-triazole, tetrazole, furan, thiophene, selenophene, oxazole, isoxazole, 1,2-thiazole, 1,3-thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 6-membered rings like pyridine, pyridazine, pyrimidine, pyrazine, 1,3,5-triazine, 1,2,4-triazine, 1,2,3-triazine, 1,2,4,5-tetrazine, 1,2,3,4-tetrazine, 1,2,3,5-tetrazine, and fused systems like indole, isoindole, indolizine, indazole, benzimidazole, benzotriazole, purine, naphthimidazole, phenanthrimidazole, pyridimidazole, pyrazinimidazole, quinoxalinimidazole, benzoxazole, naphthoxazole, anthroxazole, phenanthroxazole, isoxazole, benzothiazole, benzofuran, isobenzofuran, dibenzofuran, quinoline, isoquinoline, pteridine, benzo-5,6-quinoline, benzo-6,7-quinoline, benzo-7,8-quinoline, benzoisoquinoline, acridine, phenothiazine, phenoxazine, benzopyridazine, benzopyrimidine, quinoxaline, phenazine, naphthyridine, azacarbazole, benzocarboline, phenanthridine, phenanthroline, thieno[2,3b]thiophene, thieno[3,2b]thiophene, dithienothiophene, isobenzothiophene, dibenzothiophene, benzothiadiazothiophene, or combinations thereof. The heteroaryl groups may be substituted with alkyl, alkoxy, thioalkyl, fluoro, fluoroalkyl or further aryl or heteroaryl substituents.

Preferred arylalkyl groups include, without limitation, 2-tolyl, 3-tolyl, 4-tolyl, 2,6-dimethylphenyl, 2,6-diethylphenyl, 2,6-di-1-propylphenyl, 2,6-di-t-butylphenyl, o-t-butylphenyl, m-t-butylphenyl, p-t-butylphenyl, 4-phenoxyphenyl, 4-fluorophenyl, 3-carbomethoxyphenyl, 4-carbomethoxyphenyl etc.

Preferred alkylaryl groups include, without limitation, benzyl, ethylphenyl, 2-phenoxyethyl, propylphenyl, diphenylmethyl, triphenylmethyl or naphthalinylmethyl.

Preferred aryloxy groups include, without limitation, phenoxy, naphthoxy, 4-phenylphenoxy, 4-methylphenoxy, biphenyloxy, anthracenyloxy, phenanthrenyloxy etc.

The aryl, heteroaryl, carbyl and hydrocarbyl groups optionally comprise one or more substitutents, preferably selected from silyl, sulpho, sulphonyl, formyl, amino, imino, nitrilo, mercapto, cyano, nitro, halogen, $C_{1-12}$alkyl, $C_{6-12}$ aryl, $C_{1-12}$ alkoxy, hydroxy and/or combinations thereof. The optional substituents may comprise all chemically possible combinations in the same group and/or a plurality (preferably two) of the aforementioned groups (for example amino and sulphonyl if directly attached to each other represent a sulphamoyl radical).

Preferred substituents include, without limitation, solubilising groups such as alkyl or alkoxy, electron withdrawing groups such as fluorine, nitro or cyano, and substituents for increasing glass transition temperature (Tg) of the polymer such as bulky groups, e.g. tert-butyl or optionally substituted aryl groups.

Preferred substituents include, without limitation, F, Cl, Br, I, —CN, —NO$_2$, —NCO, —NCS, —OCN, —SCN, —C(=O)NR$^0$R$^{00}$, —C(=O)X, —C(=O)R$^0$, —NR$^0$R$^{00}$, wherein R$^0$, R$^{00}$ and X are as defined above, optionally substituted silyl, aryl with 4 to 40, preferably 6 to 20 C atoms, and straight chain or branched alkyl, alkoxy, alkylcarbonyl, alkoxycarbonyl, alkylcarbonyloxy or alkoxycarbonyloxy with 1 to 20, preferably 1 to 12 C atoms, wherein one or more H atoms are optionally replaced by F or Cl.

If the groups R$^1$ and R$^2$ and/or the groups R$^3$ and R$^4$ form a spiro group together with the fluorene group, it is preferably spirobifluorene.

Ar in formula I is either a single bond or denotes an optionally substituted mononuclear or polynuclear aryl group.

In a preferred embodiment Ar is a single bond.

In another preferred embodiment Ar is selected from optionally substituted indenofluorene, optionally substituted spirobifluorene, optionally substituted 9,10-dihydrophenanthrene or optionally substituted phenanthrene.

The index m in formula I is preferably <10, very preferably 1, 2, 3, 4 or 5.

In units of formula I wherein m>1, the meanings of B and B' in each indenofluorene group are selected independently of the other indenofluorene groups. Thus, the units of formula I may consist exclusively of fused cis-indenfluorene moieties, or may consist exclusively of fused trans-indenofluorene moieties, or may comprise alternating or random sequences of fused cis- and trans-indenofluorene moieties.

The units of formula I are preferably selected from the following subformulae:

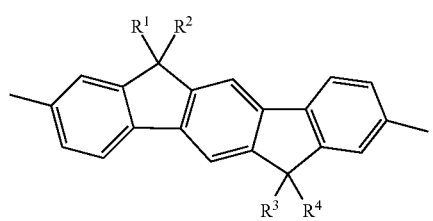

I1

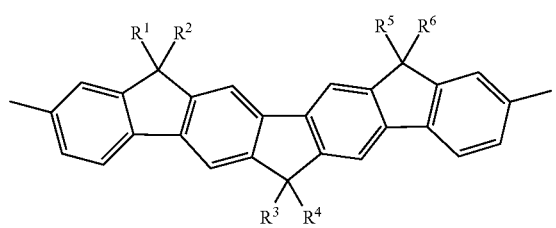

I2

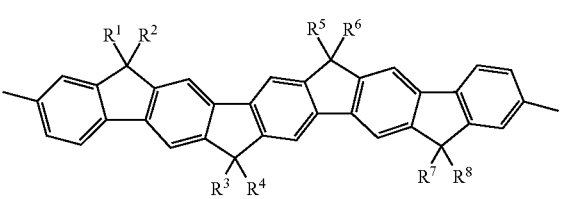

I3

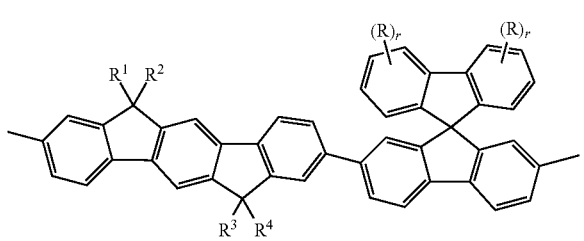

I4

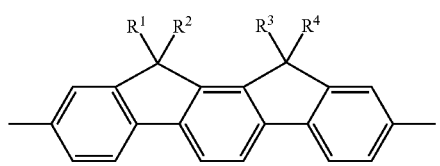

I5

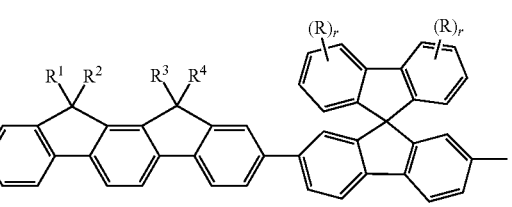

I6

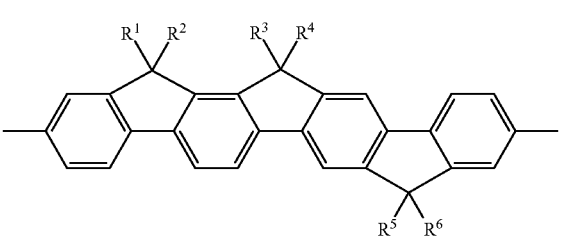

I7

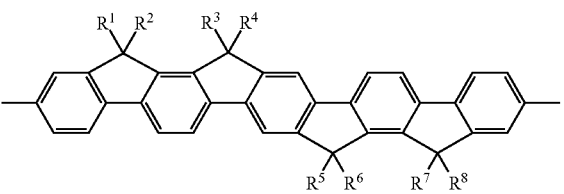

I8

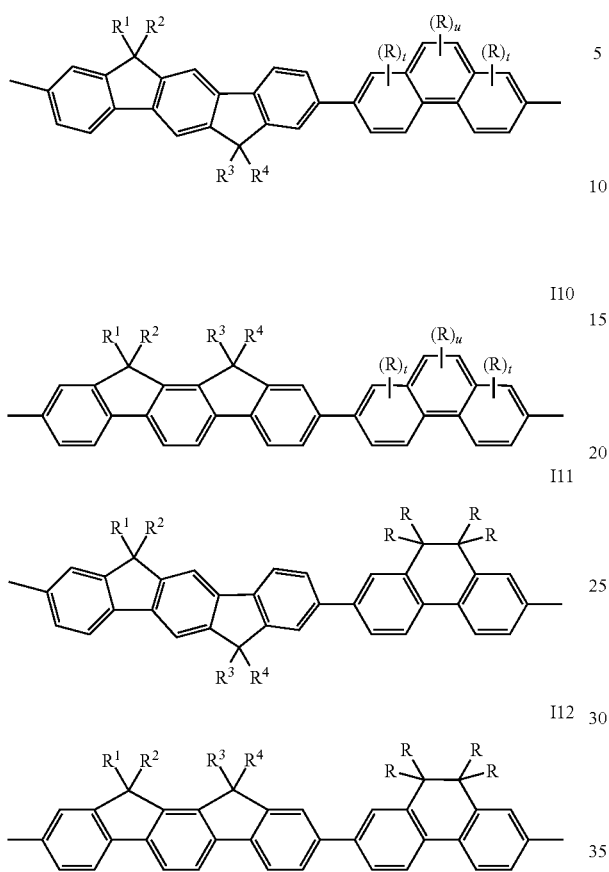

wherein $R^{1-4}$ are as defined in formula I, R and $R^{5-8}$ independently of each other have one of the meanings of $R^1$ given in formula I, r is 0, 1, 2, 3 or 4, t is 0, 1 or 2 and u is 0, 1, 2 or 3.

Particularly preferred units of formula I are selected from the following subformulae:

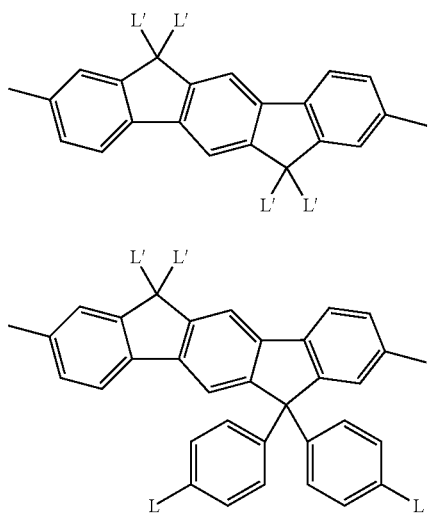

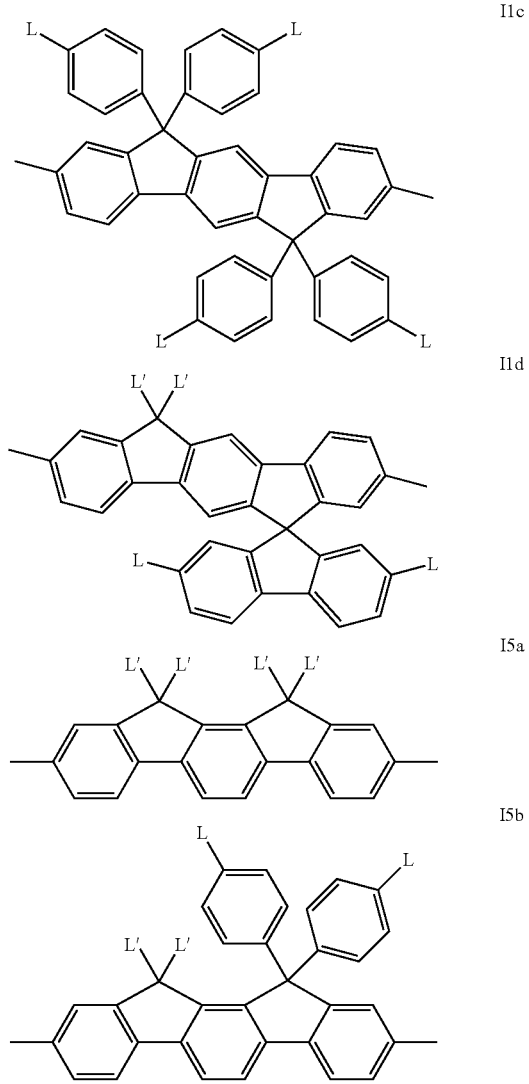

wherein
L is H, halogen or optionally fluorinated, linear or branched alkyl or alkoxy with 1 to 12 C atoms, and is preferably H, F, methyl, i-propyl, t-butyl, n-pentoxy, or trifluoromethyl, and
L' is optionally fluorinated, linear or branched alkyl or alkoxy with 1 to 12 C atoms, and is preferably n-octyl or n-octyloxy.

The ratio of units of formula I in the polymers is preferably <40 mol %, very preferably ≦30 mol %, most preferably ≦25 mol %, and preferably ≧5 mol %.

In addition to the units of formula I as disclosed above and below, the polymers according to the present invention comprise one or more, preferably one, additional type of units, preferably selected from units having hole or electron transporting properties.

The amount of said additional units in the polymers is typically >≧50 mol %, preferably ≧60 mol %, in particular ≧70 mol %, most preferably ≧75 mol %.

The polymers according to the present invention comprise not more than two, and very preferably do exclusively consist of two, different types of units, one of which is selected of formula I and the other is selected of the formulae shown hereinafter.

Additional units having hole transport properties are preferably selected from formula II

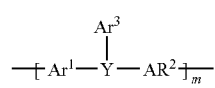

wherein
Y is N, P, P=O, PF$_2$, P=S, As, As=O, As=S, Sb, Sb=O or Sb=S, preferably N, Ar$^1$ which may be the same or different, denote, independently if in different repeat units, a single bond or an optionally substituted mononuclear or polynuclear aryl group, Ar$^2$ which may be the same or different, denote, independently if in different repeat units, an optionally substituted mononuclear or polynuclear aryl group, Ar$^3$ which may be the same or different, denote, independently if in different repeat units, an optionally substituted mononuclear or polynuclear aryl group, which may be optionally substituted by a bridging group linking different chain residues of formula III, and m is 1, 2 or 3.

Especially preferred are triarylamines and derivatives thereof.

The units of formula II are preferably selected from the following subformulae:

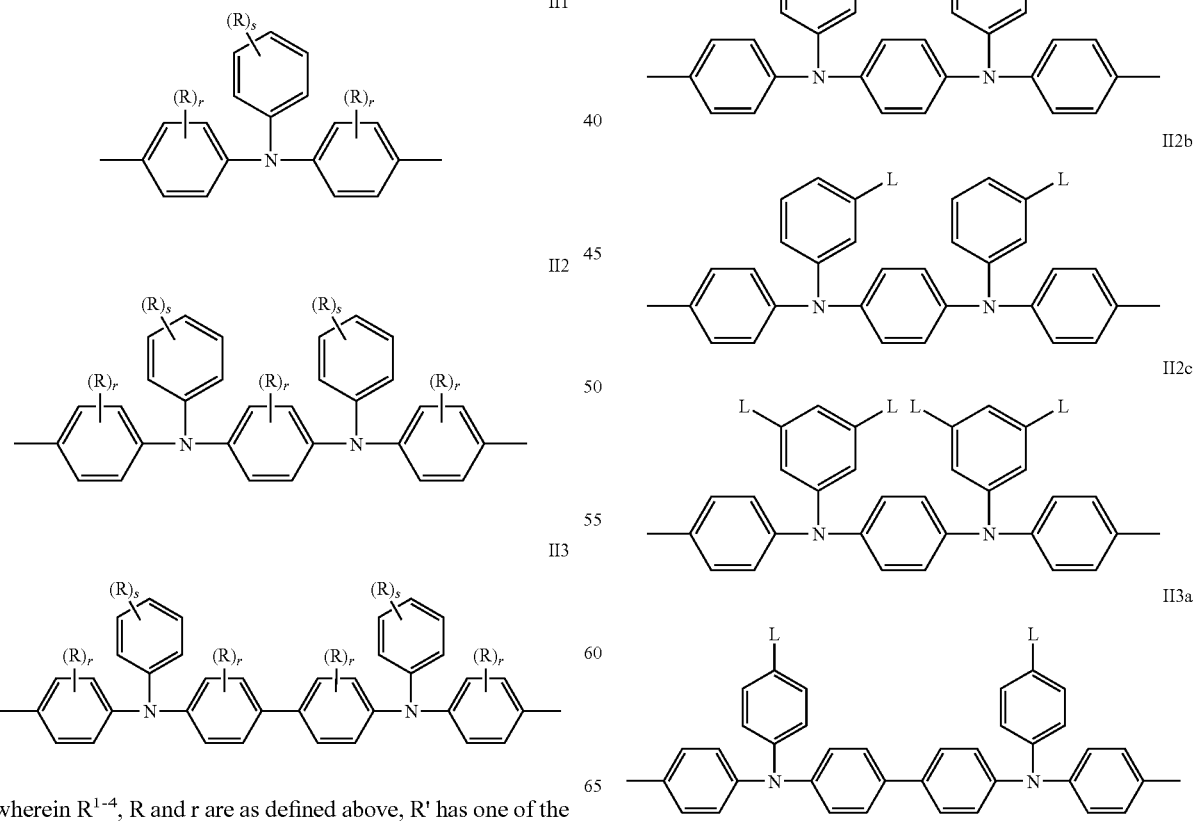

wherein R$^{1-4}$, R and r are as defined above, R' has one of the meanings of R$^1$ in formula I, and s is 0, 1, 2, 3, 4 or 5.

Particularly preferred units of formula II are selected from the following subformulae:

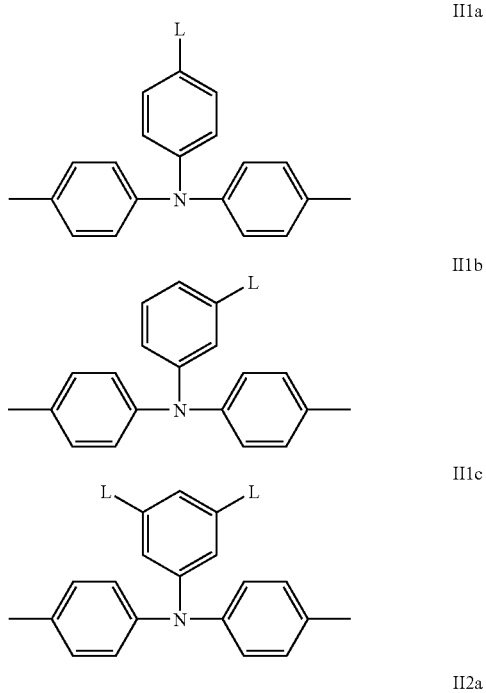

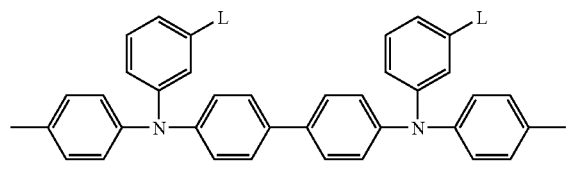
II3b

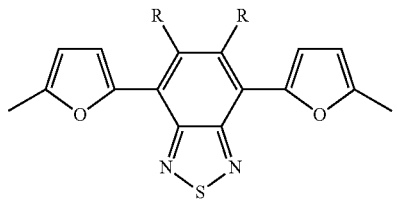
VII

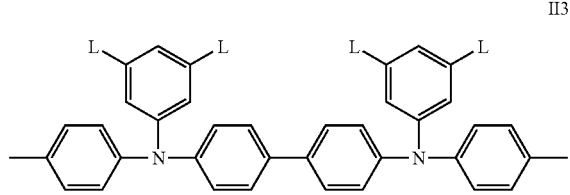
II3c

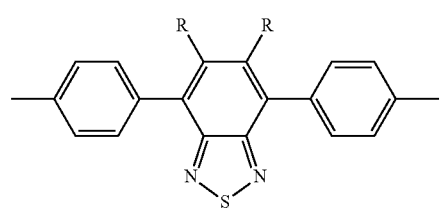
VIII wherein L and L' are as defined above, L is preferably i-propyl, t-butyl or trifluoromethyl and L' is preferably n-octyl or n-octyloxy.

Additional units having electron transport properties are preferably selected from the following formulae

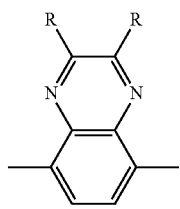
III

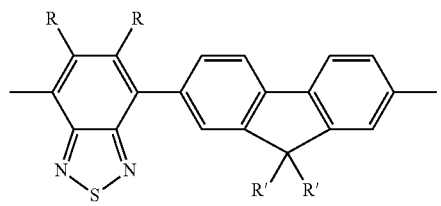
IX

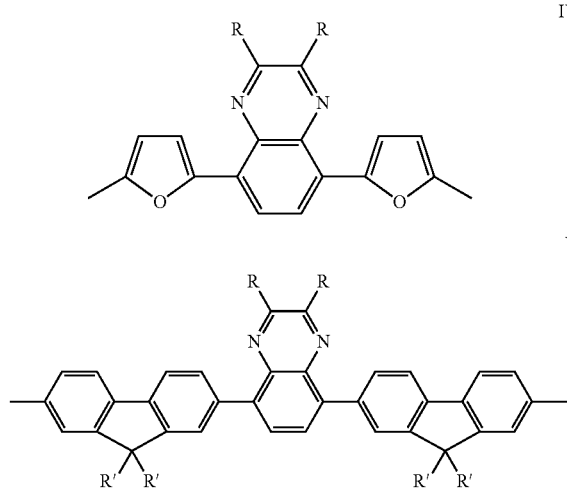

IV

V

VI wherein R and R' are as defined above, and are preferably H, alkyl, aryl, perfluoroalkyl, thioalkyl, cyano, alkoxy, heteroaryl, alkylaryl, or arylalkyl.

R is preferably H, phenyl or alkyl having 1, 2, 3, 4, 5 or 6 C atoms. R' is preferably n-octyl or n-octyloxy.

The polymers of the present invention may be statistical or random copolymers, alternating or regioregular copolymers, block copolymers or combinations thereof. They may comprise two, three or more distinct monomer units.

The polymers are preferably selected of the following formula

1 wherein

A is a unit of formula I or its preferred subformulae,

B is a unit having hole or electron transporting properties, preferably selected of formula II-IX or their preferred subformulae, x is >0 and <0.5, y is >0.5 and <1, x+y is 1, n is an integer >1.

Preferred polymers of formula I are selected from the following subformulae

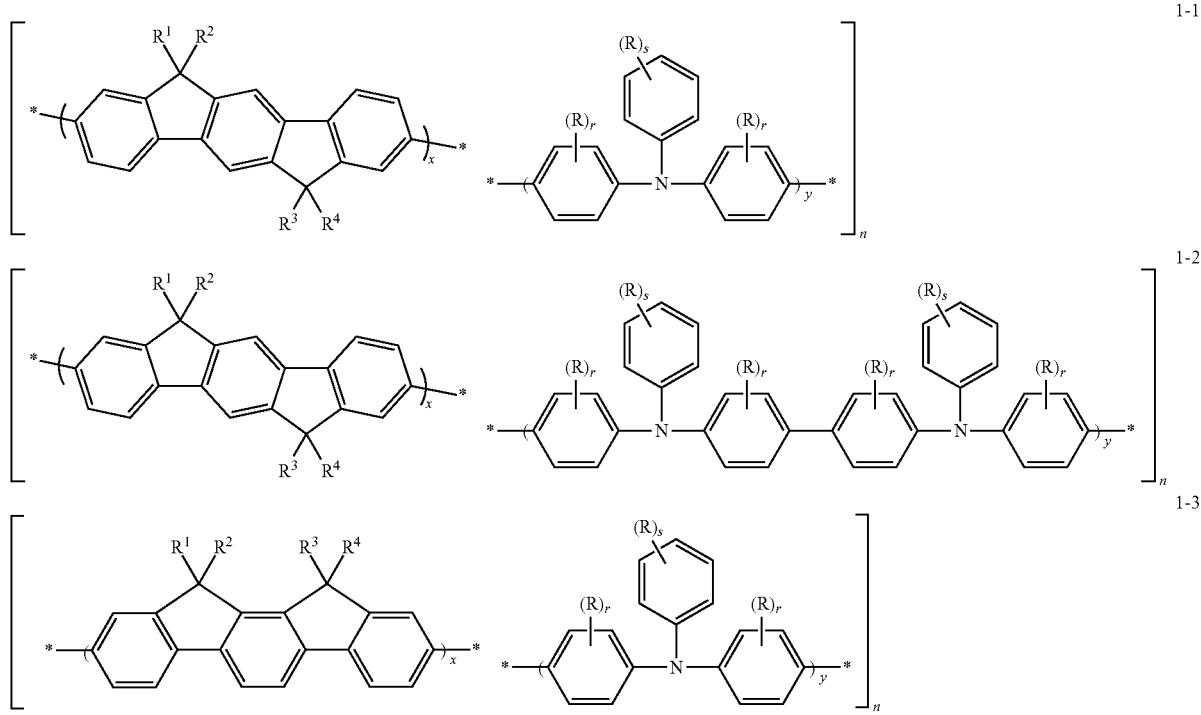

wherein $R^{1-4}$, R, R', r, s, x, y and n are as defined above.

In the polymers according to the present invention, the number of repeating units n is preferably from 10 to 10,000, very preferably from 50 to 5,000, most preferably from 50 to 2,000.

The polymers of the present invention may be prepared by any suitable method. For example, they can be suitably prepared by aryl-aryl coupling reactions, such as Yamamoto coupling, Suzuki coupling, Stille coupling, Sonogashira coupling or Heck coupling. Suzuki coupling and Yamamoto coupling are especially preferred.

The monomers which are polymerised to form the repeat units of the polymers of the present invention can be prepared according to suitable methods which are known to the expert and have been disclosed in the literature. Suitable and preferred methods for the preparation of the indenofluorene monomers of formula I are described for example in WO 2004/041901. Suitable and preferred methods for the preparation of the indenofluorene monomers of formula II are described for example in EP2004006721. Suitable and preferred methods for the preparation of the triarylamine monomers of formula III are described for example in WO 99/54385.

Preferably the polymers are prepared from monomers comprising one of the above mentioned groups of formula I-X, which are linked to two polymerisable groups P. Accordingly, for example the indenofluorene monomers are selected of the following formula

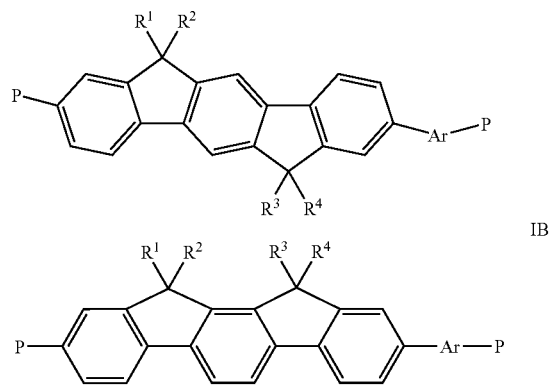

wherein P is a polymerisable group and Ar, $R^{1-4}$ are as defined above. The other co-monomers, like e.g. triarylamine monomers, are built accordingly.

Preferably the groups P are independently of each other selected from Cl, Br, I, O-tosylate, O-triflate, O-mesylate, O-nonaflate, $SiMe_2F$, $SiMeF_2$, $O\!-\!SO_2Z$, $B(OZ^1)_2$, $-CZ^2\!\!=\!\!C(Z^2)_2$, $-C\!\!\equiv\!\!CH$ and $Sn(Z^3)_3$, wherein Z and $Z^{1-3}$ are selected from the group consisting of alkyl and aryl, each being optionally substituted, and two groups $Z^1$ may also form a cyclic group.

Another aspect of the invention is a process for preparing a polymer by coupling one or more monomers based on a unit of formula I with one or more monomers based on a unit selected from formulae II-IX, and optionally with further units, in a polymerisation reaction.

Preferred methods for polymerisation are those leading to C—C-coupling or C—N-coupling, like Suzuki polymerisation, as described for example in WO 00/53656, Yamamoto polymerisation, as described in for example in T. Yamamoto et al., Progress in Polymer Science 1993, 17, 1153-1205 or in WO 2004/022626 A1, and Stille coupling. For example, when synthesizing a linear polymer by Yamamoto polymerisation, a monomer as described above having two reactive halide groups P is preferably used. When synthesizing a linear polymer by Suzuki polymerisation, preferably a monomer as described above is used wherein at least one reactive group P is a boron derivative group.

Suzuki polymerisation may be used to prepare regioregular, block and random copolymers. In particular, random copolymers may be prepared from the above monomers wherein one reactive group P is halogen and the other reactive group P is a boron derivative group. Alternatively, block or regioregular copolymers, in particular AB copolymers, may be prepared from a first and a second of the above monomers wherein both reactive groups of the first monomer are boron and both reactive groups of the second monomer are halide. The synthesis of block copolymers is described in detail for example in WO 2005/014688 A2.

Suzuki polymerisation employs a Pd(0) complex or a Pd(II) salt. Preferred Pd(0) complexes are those bearing at least one phosphine ligand such as $Pd(Ph_3P)_4$. Another preferred phosphine ligand is tris(ortho-tolyl)phosphine, i.e. $Pd(o-Tol)_4$. Preferred Pd(II) salts include palladium acetate, i.e. $Pd(OAc)_2$. Suzuki polymerisation is performed in the presence of a base, for example sodium carbonate, potassium phosphate or an organic base such as tetraethylammonium carbonate. Yamamoto polymerisation employs a Ni(0) complex, for example bis(1,5-cyclooctadienyl) nickel(0).

As alternatives to halogens as described above, leaving groups of formula $-O-SO_2Z$ can be used wherein Z is as described above. Particular examples of such leaving groups are tosylate, mesylate and triflate.

A further aspect of the present invention is an organic semiconductor material, layer or component comprising one or more polymers described above and below. A further aspect is the use of the polymers or materials as described above and below in an electronic or electrooptical component or device. A further aspect is an electronic component or device comprising a polymer or material as described above and below.

The electronic or electrooptical component or device is for example an organic field effect transistor (OFET), thin film transistor (TFT), integrated circuit (IC), radio frequency identification (RFID) tag, photodetector, sensor, logic circuit, memory element, capacitor, organic photovoltaic (OPV) cell, charge injection layer, charge transport layer, Schottky diode, planarising layer, antistatic film, polymer electrolyte membrane (PEM), conducting substrate or pattern, photoconductor, electrophotographic element, or organic light emitting diode (OLED).

The polymers of the present invention are typically used as organic semiconductors in form of thin organic layers or films, preferably less than 30 microns thick. Typically the semiconducting layer of the present invention is at most 1 micron (=1 μm) thick, although it may be thicker if required. For various electronic device applications, the thickness may also be less than about 1 micron thick. For use in an OFET, the layer thickness may typically be 500 nm or less, in an OLEDs be 100 nm or less. The exact thickness of the layer will depend, for example, upon the requirements of the electronic device in which the layer is used.

For example, the active semiconductor channel between the drain and source in an OFET may comprise a layer of the present invention. As another example, a hole injection or transport layer, and or an electron blocking layer in an OLED device may comprise a layer of the present invention.

An OFET device according to the present invention preferably comprises:
a source electrode,
a drain electrode,
a gate electrode,
a semiconducting layer,
one or more gate insulator layers,
optionally a substrate.
wherein the semiconductor layer preferably comprises one or more polymers as described above and below.

The gate, source and drain electrodes and the insulating and semiconducting layer in the OFET device may be arranged in any sequence, provided that the source and drain electrode are separated from the gate electrode by the insulating layer, the gate electrode and the semiconductor layer both contact the insulating layer, and the source electrode and the drain electrode both contact the semiconducting layer.

Preferably the electronic device is an OFET comprising an insulator having a first side and a second side, a gate electrode located on the first side of the insulator, a layer comprising a polymer of the present invention located on the second side of the insulator, and a drain electrode and a source electrode located on the polymer layer.

The OFET device can be a top gate device or a bottom gate device. Suitable structures and manufacturing methods of an OFET device are known to the skilled in the art and are described in the literature, for example in WO 03/052841.

The gate insulator layer may comprise for example a fluoropolymer, like e.g. the commercially available Cytop 809M® or Cytop 107M® (from Asahi Glass). Preferably the gate insulator layer is deposited, e.g. by spin-coating, doctor blading, wire bar coating, spray or dip coating or other known methods, from a formulation comprising an insulator material and one or more solvents with one or more fluoro atoms (fluorosolvents), preferably a perfluorosolvent. A suitable perfluorosolvent is e.g. FC75® (available from Acros, catalogue number 12380). Other suitable fluoropolymers and fluorosolvents are known in prior art, like for example the perfluoropolymers Teflon AF® 1600 or 2400 (from DuPont) or Fluoropel® (from Cytonix) or the perfluorosolvent FC 43® (Acros, No. 12377).

Further preferred is an integrated circuit comprising a field effect transistor according to the present invention.

Further preferred is a photovoltaic cell comprising a polymer or layer according to the present invention.

Besides the devices mentioned above, the polymers of the present invention may also function as electron transporting components of an organic light emitting device (OLED). In particular, it can be used as hole or electron transport, injection or blocking layer in PLEDs.

The polymers of the present invention may also be used in polymer electrolyte membranes, e.g. for fuel cells. A fuel cell using a polymer electrolyte membrane typically consists of a positive electrode layer and a negative electrode layer disposed on the front and rear sides of the polymer electrolyte membrane (PEM). To generate electricity, hydrogen will be brought into contact with a catalyst in the negative electrode layer and oxygen into contact with a catalyst in the positive electrode layer. The PEM is responsible for the proton transport. The typically used method to make a PEM is through sulfonation and/or phosphonation.

Another aspect of the invention relates to a solution comprising one or more polymers as described above and below and one or more organic solvents.

Another aspect of the invention relates to a dispersion, wherein one or more polymers as described above and below are sulfonated or phosphonated and formed a dispersion in water or one/more organic solvents. Suitable and preferred methods for sulfonation or phosphosation are described in Chemical Review 2004, Vol 104, 45687. Such dispersions are suitable for example for use in polymer electrolyte membranes (PEMs).

Examples of suitable and preferred organic solvents include, without limitation, dichloromethane, trichloromethane, monochlorobenzene, o-dichlorobenzene, tetrahydrofuran, anisole, morpholine, toluene, o-xylene, m-xylene, p-xylene, 1,4-dioxane, acetone, methylethylketone, 1,2-dichloroethane, 1,1,1-trichloroethane, 1,1,2,2-tetrachloroethane, ethyl acetate, n-butyl acetate, dimethylformamide, dimethylacetamide, dimethylsulfoxide, tetralin, decalin, indane and/or mixtures thereof.

The concentration of the polymers in the solution is preferably 0.1 to 10% by weight, more preferably 0.5 to 5% by weight.

After the appropriate mixing and ageing, solutions are evaluated as one of the following categories: complete solution, borderline solution or insoluble. The contour line is drawn to outline the solubility parameter-hydrogen bonding limits dividing solubility and insolubility. 'Complete' solvents falling within the solubility area can be chosen from literature values such as published in "Crowley, J. D., Teague, G. S. Jr and Lowe, J. W. Jr., Journal of Paint Technology, 38, No 496, 296 (1966)". Solvent blends may also be used and can be identified as described in "Solvents, W. H. Ellis, Federation of Societies for Coatings Technology, p 9-10, 1986". Such a procedure may lead to a blend of 'non' solvents that will dissolve both the polymers of the present invention, although it is desirable to have at least one true solvent in a blend.

It is desirable to generate small structures or patterns in modern microelectronics to reduce cost (more devices/unit area), and power consumption. Patterning of the layer of the invention may be carried out by photolithography.

For use as semiconducting layer the polymers or solutions of the present invention may be deposited by any suitable method. Liquid coating of organic electronic devices such as field effect transistors is more desirable than vacuum deposition techniques. Solution deposition methods are especially preferred. Preferred deposition techniques include, without limitation, dip coating, spin coating, ink jet printing, letterpress printing, screen printing, doctor blade coating, roller printing, reverse-roller printing, offset lithography printing, flexographic printing, web printing, spray coating, brush coating or pad printing. Ink-jet printing is particularly preferred as it allows high resolution displays to be prepared.

Selected solutions of the present invention may be applied to prefabricated device substrates by ink jet printing or microdispensing. Preferably industrial piezoelectric print heads such as but not limited to those supplied by Aprion, Hitachi-Koki, InkJet Technology, On Target Technology, Picojet, Spectra, Trident, Xaar may be used to apply the organic semiconductor layer to a substrate. Additionally semi-industrial heads such as those manufactured by Brother, Epson, Konica, Seiko Instruments Toshiba TEC or single nozzle microdispensers such as those produced by Microdrop and Microfab may be used.

In order to be applied by ink jet printing or microdispensing, the polymers should be first dissolved in a suitable solvent. Solvents must fulfil the requirements stated above and must not have any detrimental effect on the chosen print head. Additionally, solvents should have boiling points >100° C., preferably >140° C. and more preferably >150° C. in order to prevent operability problems caused by the solution drying out inside the print head. Apart from the solvents mentioned above, suitable solvents include substituted and non-substituted xylene derivatives, di-$C_{1-2}$-alkyl formamide, substituted and non-substituted anisoles and other phenol-ether derivatives, substituted heterocycles such as substituted pyridines, pyrazines, pyrimidines, pyrrolidinones, substituted and non-substituted N,N-di-$C_{1-2}$-alkylanilines and other fluorinated or chlorinated aromatics.

A preferred solvent for depositing a polymer according to the present invention by ink jet printing comprises a benzene derivative which has a benzene ring substituted by one or more substituents wherein the total number of carbon atoms among the one or more substituents is at least three. For example, the benzene derivative may be substituted with a propyl group or three methyl groups, in either case there being at least three carbon atoms in total. Such a solvent enables an ink jet fluid to be formed comprising the solvent with the polymer, which reduces or prevents clogging of the jets and separation of the components during spraying. The solvent(s) may include those selected from the following list of examples: dodecylbenzene, 1-methyl-4-tert-butylbenzene, terpineol limonene, isodurene, terpinolene, cymene, diethylbenzene. The solvent may be a solvent mixture, that is a combination of two or more solvents, each solvent preferably having a boiling point >100° C., more preferably >140° C. Such solvent(s) also enhance film formation in the layer deposited and reduce defects in the layer.

The ink jet fluid (that is mixture of solvent, binder and semiconducting compound) preferably has a viscosity at 20° C. of 1-100 mPa·s, more preferably 1-50 mPa·s and most preferably 1-30 mPa·s.

The polymers or solutions according to the present invention can additionally comprise one or more further components like for example surface-active compounds, lubricating agents, wetting agents, dispersing agents, hydrophobing agents, adhesive agents, flow improvers, defoaming agents, deaerators, diluents which may be reactive or non-reactive, auxiliaries, colourants, dyes or pigments, sensitizers, stabilizers, nanoparticles or inhibitors.

Unless the context clearly indicates otherwise, as used herein plural forms of the terms herein are to be construed as including the singular form and vice versa.

Throughout the description and claims of this specification, the words "comprise" and "contain" and variations of the words, for example "comprising" and "comprises", mean "including but not limited to", and are not intended to (and do not) exclude other components.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

It will be appreciated that many of the features described above, particularly of the preferred embodiments, are inventive in their own right and not just as part of an embodiment of the present invention. Independent protection may be sought for these features in addition to or alternative to any invention presently claimed.

The invention will now be described in more detail by reference to the following examples, which are illustrative only and do not limit the scope of the invention.

EXAMPLE 1

Polymers

The following polymers are synthesized by Suzuki coupling as disclosed in WO03/048225.

Polymer 1 is the copolymer of following monomers:

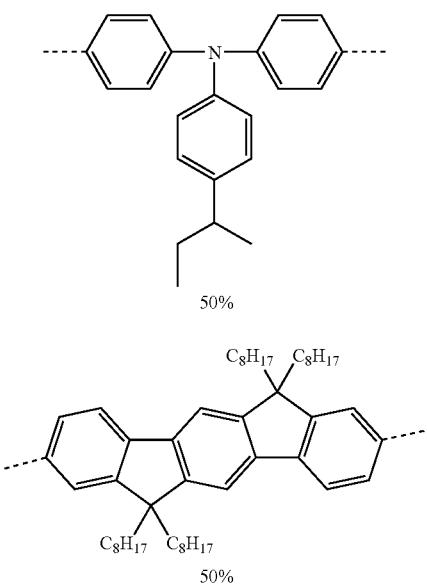

Polymer 2 is the copolymer of following monomers:

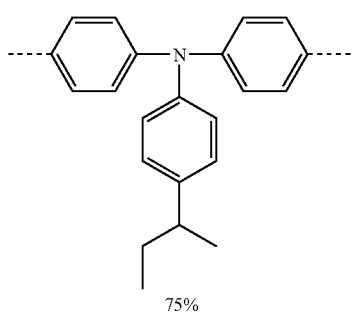

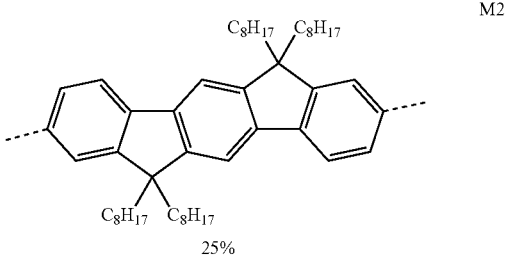

EXAMPLE 2

OFET Preparation and Measurements

Organic field-effect transistors are fabricated on highly conductive Si wafers (1-5 mΩ cm) with a 230 nm thick thermally grown oxide, which acts as gate insulator. Photo-lithographically patterned Ti (1 mm)/Au (100 nm) source and drain electrodes are made by electron-beam evaporation and by lift-off process. These structures are cleaned in an ultrasonic bath with solvents (acetone and isopropyl) and ultra-pure water. The substrates are dried with pure nitrogen, treated with an $O_2$ plasma for 60 s at 200 W and 0.6 mbar, and heated in fore-vacuum at 400 K for 2 h. Thin semiconductor films are then deposited by spin-coating polymer solutions in Toluene (10 g/L) on the OFET substrates. The device is then heated at 70° C. for 0.5 hour in glovebox under nitrogen to remove residual solvent, and then cooled to room temperature to measure the transistor characteristics. The electrical characterization of the transistor devices is carried out in Glovebox at room temperature using two independent source meter units (Kethley 236) controlled by a LabView Program.

Transistors with ring-type geometry as shown in FIG. 1 are used, whose source electrodes form a closed ring around the drain electrodes. This prevents parasitic currents from outside of the active transistor channel without the necessity of structuring the organic semiconductor. The channel length and width are 10 and 2500 μm, respectively.

Figure 2:
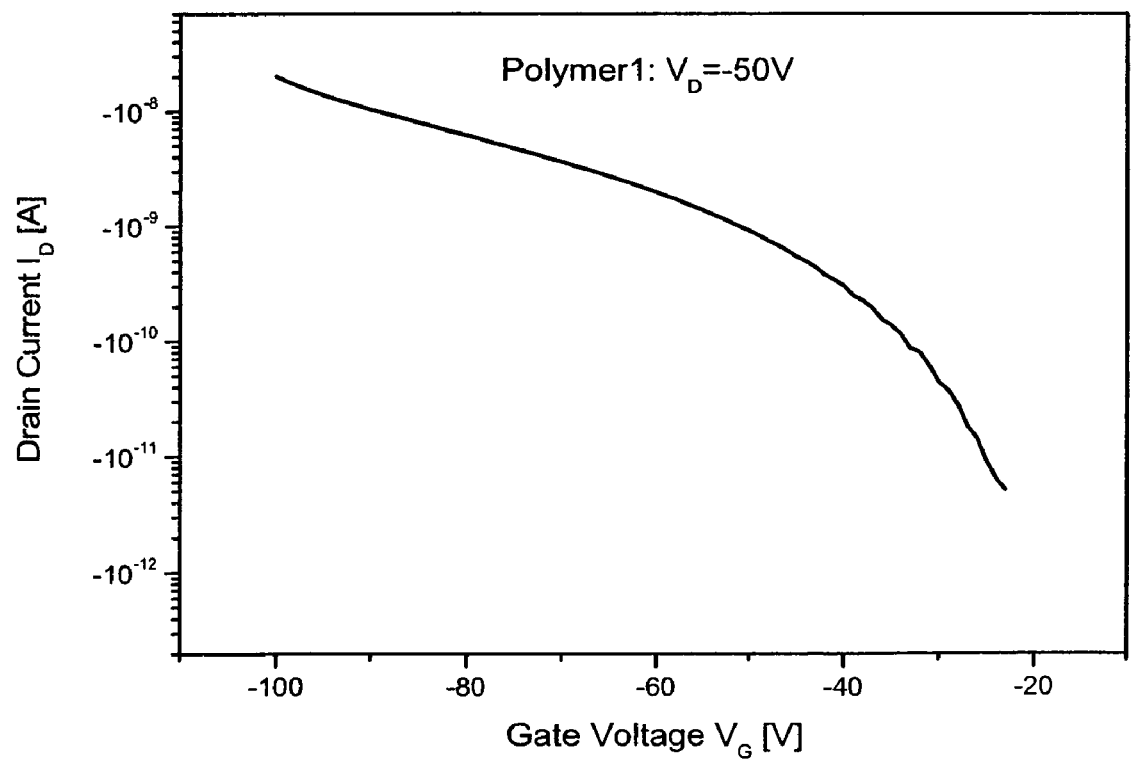
FIG. 2 shows the transfer characteristics for a transistor comprising polymer 1 of example 1 of the present invention.
Figure 3:
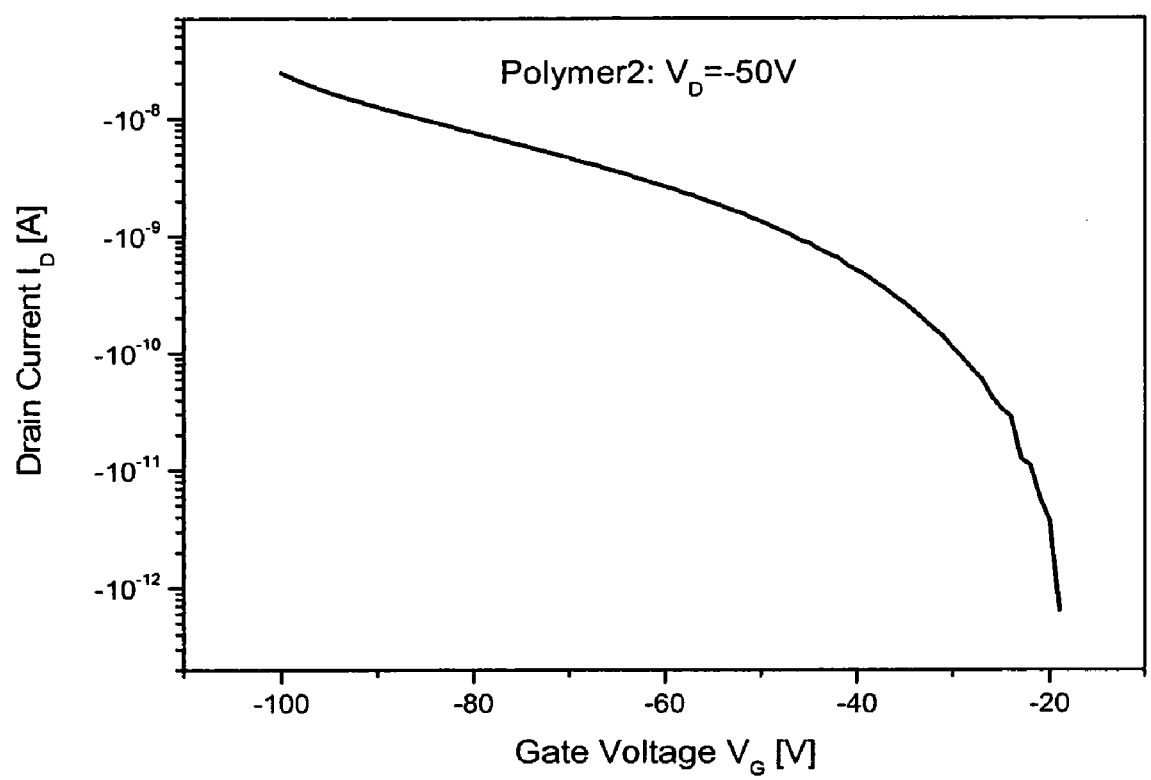
FIG. 3 shows the transfer characteristics for a transistor comprising polymer 2 of example 1 of the present invention.

The transfer characteristics for polymer 1 are shown FIG. 2, and for polymer 2 in FIG. 3. The devices show p-type behaviour. Field effect mobility is calculated in the linear regime using equation (1b):

$$I_D = \frac{W}{L}\mu C\left[(V_G - V_T)V_{DS} - \frac{1}{2}V_{DS}^2\right] \quad (1a)$$

$$\mu = \frac{\partial I_D}{\partial V_G} \times \frac{L}{WCV_{DS}} \quad (1b)$$

Where:
μ is the charge carrier mobility
W is the length of the drain and source electrode
L is the distance of the drain and source electrode
$I_D$ is the source-drain current
C is the capacitance per unit area of the gate dielectric
$V_G$ is the gate voltage (in V)
$V_{DS}$ is the source-drain voltage
$V_T$ is the threshold voltage The mobility μ extracted by Equation (1b) is $1.1 \times 10^{-5}$ cm$^2$/Vs for polymer 1 and $1.9 \times 10^{-5}$ cm$^2$/Vs for polymer 2. This indicates that the polymer 2 has a mobility of almost 2 times as that of polymer 1.

The absolute mobility can be dramatically improved by using the optimised dielectrical materials, and other source-drain electrode materials.

The invention claimed is:
1. Polymer comprising >0 mol % and <40 mol % of one or more identical or different units comprising an indenofluorene group of formula I

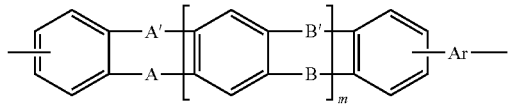

I wherein
one of A and A' is a single bond and the other is $CR^1R^2$,
one of B and B' is a single bond and the other is $CR^3R^4$,
$R^{1-4}$ are independently of each other identical or different groups selected from H, halogen, —CN, —NC, —NCO, —NCS, —OCN, —SCN, —C(=O)NR$^0$R$^{00}$, —C(=O)X, —C(=O)R$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, optionally substituted silyl, or a straight-chain, branched or cyclic alkyl with 1 to 40 C-atoms, which is unsubstituted, mono- or polysubstituted by F, Cl, Br, I or CN, and wherein one or more non-adjacent CH$_2$ groups are optionally replaced, in each case independently from one another, by —O—, —S—, —NH—, —NR$^0$—, —SiR$^0$R$^{00}$—, —CO—, —COO—, —OCO—, —O—CO—O—, —S—CO—, —CO—S—, —SO$_2$—, —CO—NR$^0$—, —NR$^0$—CO—, —NR$^0$—CO—NR$^{00}$—, —CX$^1$=CX$^2$— or —C≡C— in such a manner that O and/or S atoms are not linked directly to one another, with R$^0$ and R$^{00}$ having one of the meanings given as described below and X$^1$ and X$^2$ being independently of each other H, F, Cl or CN,
X is halogen,
R$^0$ and R$^{00}$ are independently of each other H or an optionally substituted carbyl or hydrocarbyl group optionally comprising one or more hetero atoms,
Ar is a single bond or denotes mononuclear or polynuclear aryl or heterorayl that is optionally substituted,
m is an integer ≧1, and
wherein optionally the groups R$^1$ and R$^2$ and/or the groups R$^3$ and R$^4$ form a spiro group with the adjacent fluorene moiety,
with the proviso that the following polymers are excluded

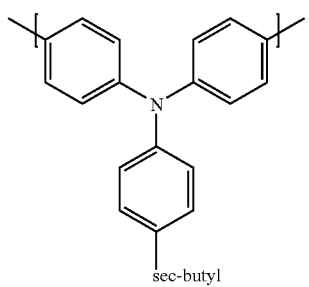

50 mol %

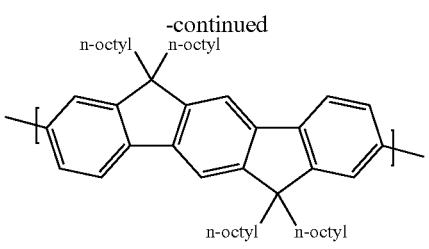

30 mol %

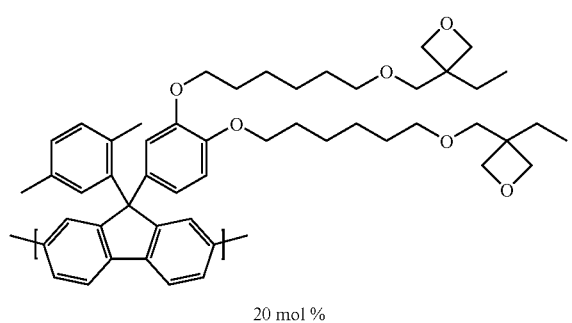

20 mol %

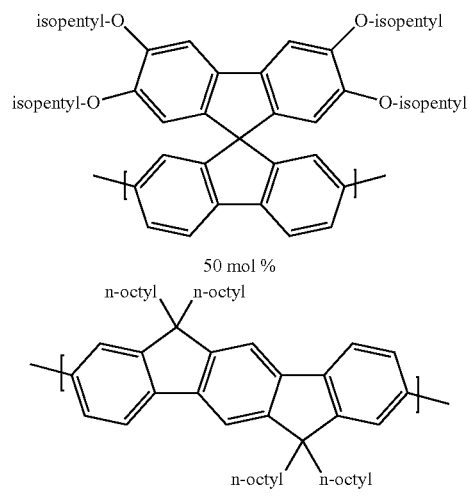

50 mol %

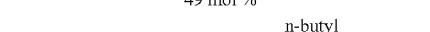

49 mol %

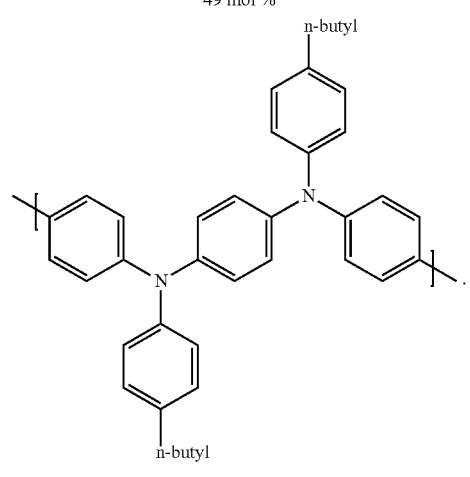

1 mol %

2. Polymer according to claim 1, characterized in that the units of formula I are selected from the following subformulae I1
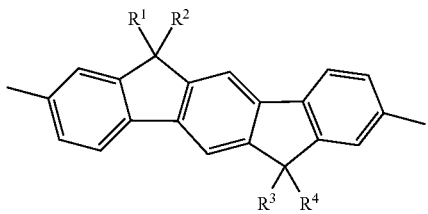

I2
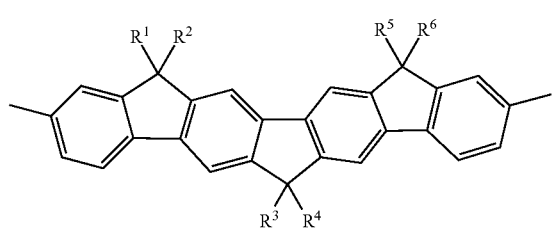

I3
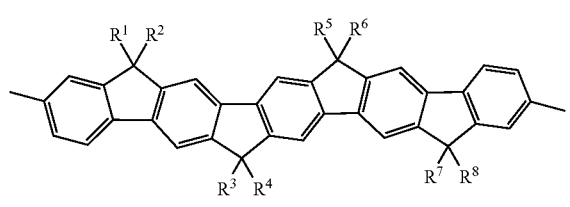

I4
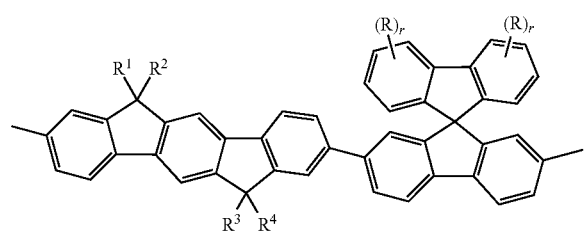

I5
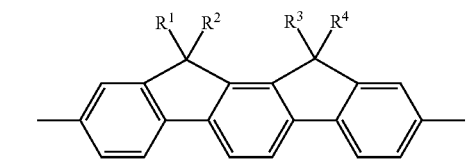

I6
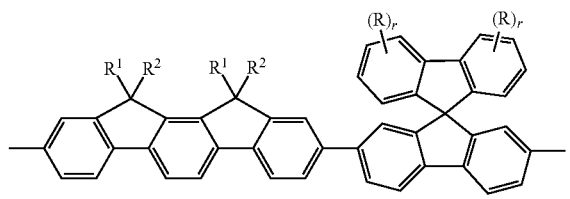

I7

I8

I9

I10

I11

I12 wherein $R^{1-4}$ are as defined in claim 1, R and $R^{5-8}$ independently of each other have one of the meanings of $R^1$ given in claim 1, r is 0, 1, 2, 3 or 4, t is 0, 1 or 2 and u is 0, 1, 2 or 3.

3. Polymer according to claim 1 or 2, characterized in that it consists of two different types of units, one of which is selected of formula I and the other is selected of units having hole or electron transporting properties.

4. Polymer according to claim 3, characterized in that the additional units are selected of formula II

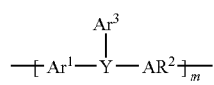
II wherein
Y is N, P, P=O, PF$_2$, P=S, As, As=O, As=S, Sb, Sb=O or Sb=S,
Ar$^1$ which may be the same or different, denote, independently if in different repeat units, a single bond or an optionally substituted mononuclear or polynuclear aryl group,
Ar$^2$ which may be the same or different, denote, independently if in different repeat units, an optionally substituted mononuclear or polynuclear aryl group,
Ar$^3$ which may be the same or different, denote, independently if in different repeat units, an optionally substituted mononuclear or polynuclear aryl group, which may be optionally substituted by a bridging group linking different chain residues of formula III, and
m is 1, 2 or 3.

5. Polymer according to claim 3, characterized in that the additional units are selected from the following formulae

III

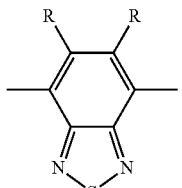

IV

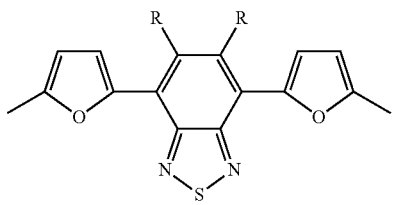

V

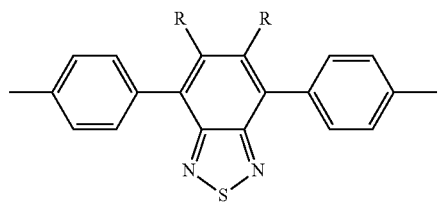

-continued

VI

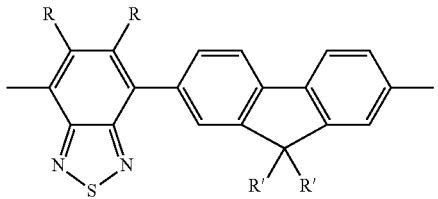

VII

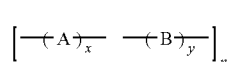

VIII

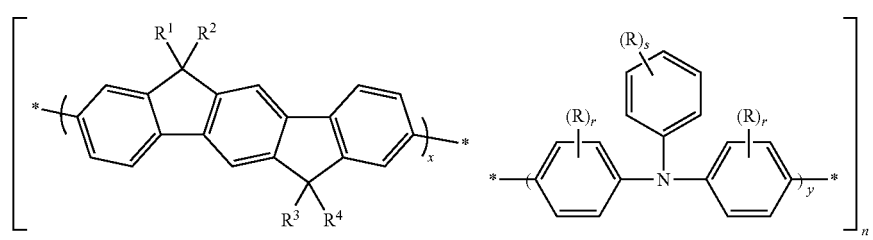

IX wherein R and R' have one of the meanings of R$^1$.

6. Polymer according to claim 4, characterized in that it is of the following formula

1 wherein
A is a unit of formula I,
B is a unit selected from formulae II,
x is >0 and <0.5,
y is >0.5 and <1,
x+y is 1,
n is an integer >1.

7. Polymer according to claim 1, characterized in that it is selected from the following formulae 1-1

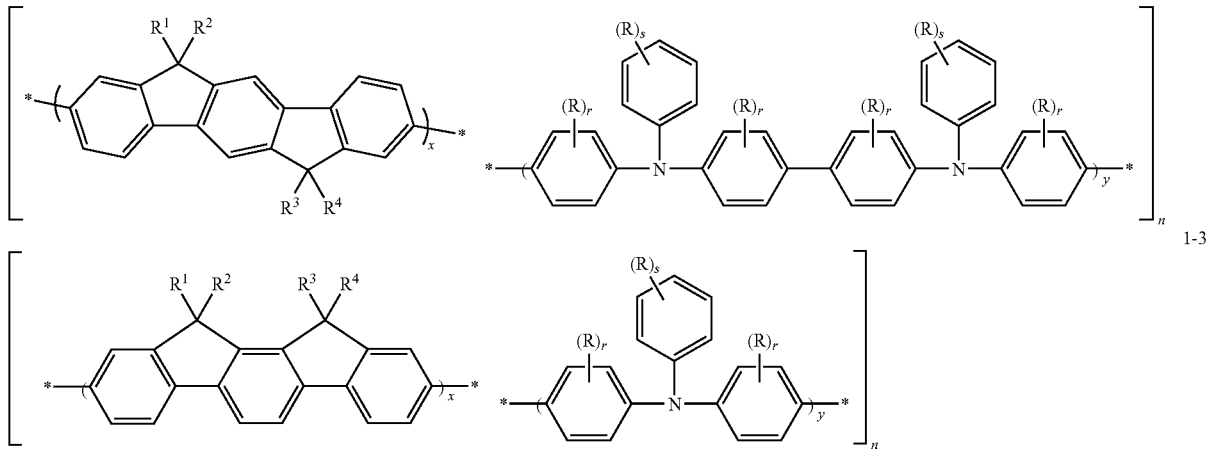

wherein $R^{1-4}$ are as defined in claim 1, R and R' independently of each other have one of the meanings of $R^1$, r is 0, 1, 2, 3 or 4, s is 0, 1, 2, 3, 4 or 5, x is >0 and <0.5, y is >0.5 and <1, provided that x+y is 1, and n is an integer >1.

8. Organic semiconductor layer or component comprising a polymer according to claim 1.

9. Electronic or electrooptical device comprising a polymer according to claim 1.

10. Electronic or electrooptical device according to claim 9, which is an organic field effect transistor (OFET), thin film transistor (TFT), integrated circuit (IC), radio frequency identification (RFID) tag, photodetector, sensor, logic circuit, memory element, capacitor, organic photovoltaic (OPV) cell, charge injection layer, charge transport layer or interlayer in polymer light emitting diodes (PLEDs), Schottky diode, planarising layer, antistatic film, polymer electrolyte membrane (PEM), conducting substrate or pattern, photoconductor, electrophotographic element or organic light emitting diode (OLED).

11. Process for preparing a polymer according to claim 3, which comprises coupling one or more monomers based on a unit of formula I with one or more monomers based on a unit having hole or electron transporting properties, and optionally with further units, in a polymerisation reaction.

12. Polymer according to claim 5, characterized in that it is of the following formula

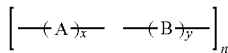

wherein
A is a unit of formula I,
B is a unit selected from formulae III-IX,
x is >0 and <0.5,
y is >0.5 and <1,
x+y is 1,
n is an integer >1.

13. Organic semiconductor layer or component comprising a polymer according to claim 2.

14. Organic semiconductor layer or component comprising a polymer according to claim 3.

15. Organic semiconductor layer or component comprising a polymer according to claim 4.

16. Organic semiconductor layer or component comprising a polymer according to claim 5.

17. Organic semiconductor layer or component comprising a polymer according to claim 6.

18. Organic semiconductor layer or component comprising a polymer according to claim 7.

19. Electronic or electrooptical device comprising a polymer according to claim 2.

20. Electronic or electrooptical device comprising a polymer according to claim 3.

21. Electronic or electrooptical device comprising a polymer according to claim 4.

22. Electronic or electrooptical device comprising a polymer according to claim 5.

23. Electronic or electrooptical device comprising a polymer according to claim 6.

24. Electronic or electrooptical device comprising a polymer according to claim 7.

25. Electronic or electrooptical device comprising a layer or component according to claim 8.

26. Electronic or electrooptical device according to claim 19, which is an organic field effect transistor (OFET), thin film transistor (TFT), integrated circuit (IC), radio frequency identification (RFID) tag, photodetector, sensor, logic circuit, memory element, capacitor, organic photovoltaic (OPV) cell, charge injection layer, charge transport layer or interlayer in polymer light emitting diodes (PLEDs), Schottky diode, planarising layer, antistatic film, polymer electrolyte membrane (PEM), conducting substrate or pattern, photoconductor, electrophotographic element or organic light emitting diode (OLED).

27. Electronic or electrooptical device according to claim 20, which is an organic field effect transistor (OFET), thin film transistor (TFT), integrated circuit (IC), radio frequency identification (RFID) tag, photodetector, sensor, logic circuit, memory element, capacitor, organic photovoltaic (OPV) cell, charge injection layer, charge transport layer or interlayer in polymer light emitting diodes (PLEDs), Schottky diode, planarising layer, antistatic film, polymer electrolyte membrane (PEM), conducting substrate or pattern, photoconductor, electrophotographic element or organic light emitting diode (OLED).

28. Electronic or electrooptical device according to claim 21, which is an organic field effect transistor (OFET), thin film transistor (TFT), integrated circuit (IC), radio frequency identification (RFID) tag, photodetector, sensor, logic circuit, memory element, capacitor, organic photovoltaic (OPV) cell, charge injection layer, charge transport layer or interlayer in polymer light emitting diodes (PLEDs), Schottky diode, planarising layer, antistatic film, polymer electrolyte membrane (PEM), conducting substrate or pattern, photoconductor, electrophotographic element or organic light emitting diode (OLED).

29. Electronic or electrooptical device according to claim 22, which is an organic field effect transistor (OFET), thin film transistor (TFT), integrated circuit (IC), radio frequency identification (RFID) tag, photodetector, sensor, logic circuit, memory element, capacitor, organic photovoltaic (OPV) cell, charge injection layer, charge transport layer or interlayer in polymer light emitting diodes (PLEDs), Schottky diode, planarising layer, antistatic film, polymer electrolyte membrane (PEM), conducting substrate or pattern, photoconductor, electrophotographic element or organic light emitting diode (OLED).

30. Electronic or electrooptical device according to claim 23, which is an organic field effect transistor (OFET), thin film transistor (TFT), integrated circuit (IC), radio frequency identification (RFID) tag, photodetector, sensor, logic circuit, memory element, capacitor, organic photovoltaic (OPV) cell, charge injection layer, charge transport layer or interlayer in polymer light emitting diodes (PLEDs), Schottky diode, planarising layer, antistatic film, polymer electrolyte membrane (PEM), conducting substrate or pattern, photoconductor, electrophotographic element or organic light emitting diode (OLED).

31. Electronic or electrooptical device according to claim 24, which is an organic field effect transistor (OFET), thin film transistor (TFT), integrated circuit (IC), radio frequency identification (RFID) tag, photodetector, sensor, logic circuit, memory element, capacitor, organic photovoltaic (OPV) cell, charge injection layer, charge transport layer or interlayer in polymer light emitting diodes (PLEDs), Schottky diode, planarising layer, antistatic film, polymer electrolyte membrane (PEM), conducting substrate or pattern, photoconductor, electrophotographic element or organic light emitting diode (OLED).

32. Electronic or electrooptical device according to claim 25, which is an organic field effect transistor (OFET), thin film transistor (TFT), integrated circuit (IC), radio frequency identification (RFID) tag, photodetector, sensor, logic circuit, memory element, capacitor, organic photovoltaic (OPV) cell, charge injection layer, charge transport layer or interlayer in polymer light emitting diodes (PLEDs), Schottky diode, planarising layer, antistatic film, polymer electrolyte membrane (PEM), conducting substrate or pattern, photoconductor, electrophotographic element or organic light emitting diode (OLED).

33. Process for preparing a polymer according to claim 4, which comprises coupling one or more monomers based on a unit of formula I with one or more monomers based on a unit of formula II, and optionally with further units, in a polymerisation reaction.

34. Process for preparing a polymer according to claim 5, which comprises coupling one or more monomers based on a unit of formula I with one or more monomers based on a unit of one of formulae III-IX, and optionally with further units, in a polymerisation reaction.

35. Process for preparing a polymer according to claim 3, which comprises coupling one or more monomers based on a unit of one of formulae I1 to I12 with one or more monomers based on a unit having hole or electron transporting properties, and optionally with further units, in a polymerisation reaction.

36. Process for preparing a polymer according to claim 4, which comprises coupling one or more monomers based on a unit of one of formulae I1 to I12 with one or more monomers based on a unit of formula II, and optionally with further units, in a polymerisation reaction.

37. Process for preparing a polymer according to claim 5, which comprises coupling one or more monomers based on a unit of one of formulae I1 to I12 with one or more monomers based on a unit of one of formulae III-IX, and optionally with further units, in a polymerisation reaction.

38. Polymer according to claim 1, which comprises less than 40 mol % of units comprising the indenofluorene group of formula I.

39. Polymer according to claim 1, which comprises less than 30 mol % of units comprising the indenofluorene group of formula I.

40. Polymer according to claim 1, which comprise more than 5 mol % and less than 40 mol % of units comprising the indenofluorene group of formula I.

* * * * *

UNITED STATES PATENT AND TRADEMARK OFFICE
CERTIFICATE OF CORRECTION

PATENT NO. : 8,278,394 B2  
APPLICATION NO. : 12/300346  
DATED : October 2, 2012  
INVENTOR(S) : Junyou Pan et al.

Page 1 of 2

It is certified that error appears in the above-identified patent and that said Letters Patent is hereby corrected as shown below:

Column 23, line 48, reads "≧", should read --≥--.

Column 25, line 61, reads as follows:

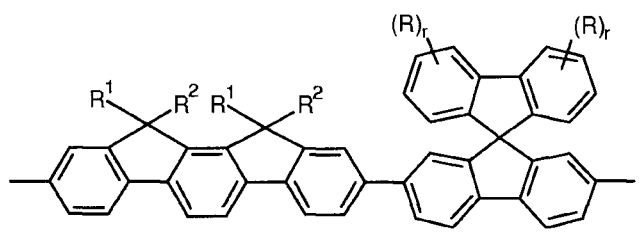

should read as follows:

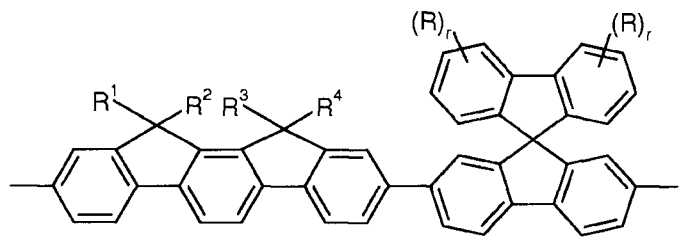

Signed and Sealed this  
Sixteenth Day of April, 2013

Teresa Stanek Rea  
*Acting Director of the United States Patent and Trademark Office*

CERTIFICATE OF CORRECTION (continued)
U.S. Pat. No. 8,278,394 B2

Column 26, line 17, reads as follows:

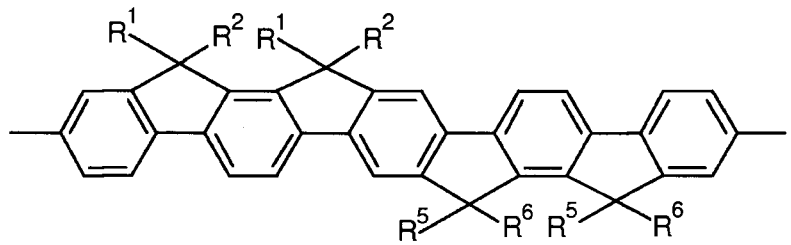

I8 should read as follows:

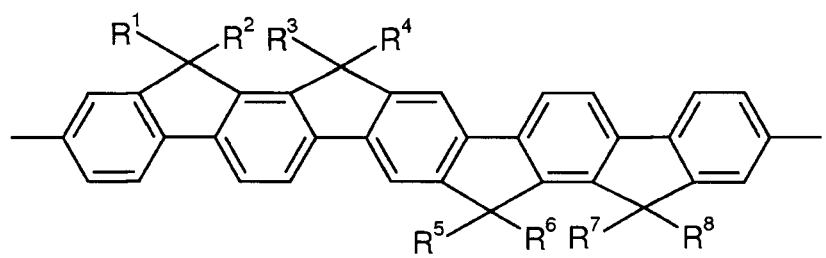

I8

Column 26, line 37, reads as follows:

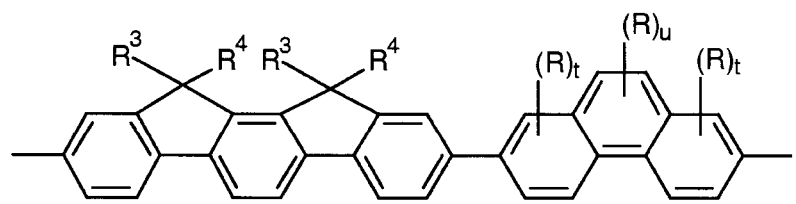

I10 should read as follows:

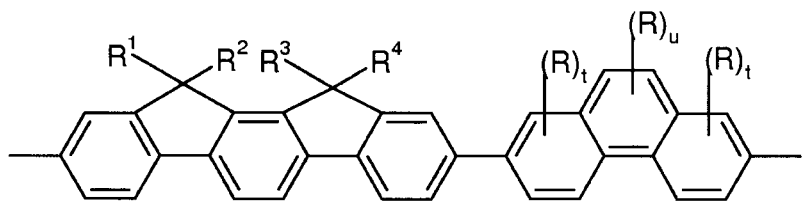

I10